United States Patent [19]
McMillan, II et al.

[11] Patent Number: 5,842,275
[45] Date of Patent: Dec. 1, 1998

[54] REFLOW SOLDERING TO MOUNTING PADS WITH VENT CHANNELS TO AVOID SKEWING

[75] Inventors: Richard Keith McMillan, II, Dearborn; Vivek Amir Jairazbhoy, Farmington Hills; Robert Joseph Gordon, Livonia; George Albert Garfinkel, Westland, all of Mich.

[73] Assignee: Ford Motor Company, Dearborn, Mich.

[21] Appl. No.: 524,097

[22] Filed: Sep. 5, 1995

[51] Int. Cl.$^6$ ........................................................ H05K 3/34
[52] U.S. Cl. .............................. 29/840; 29/832; 174/262; 174/263; 228/180.21
[58] Field of Search ............................ 29/829, 832, 840; 228/180.21; 174/262, 263

[56] References Cited

U.S. PATENT DOCUMENTS

| | | |
|---|---|---|
| 3,353,139 | 11/1967 | Ribbelink . |
| 3,710,196 | 1/1973 | Fifield . |
| 3,888,639 | 6/1975 | Hastings et al. ................ 29/470.5 |
| 4,139,881 | 2/1979 | Shimizu et al. ................... 361/400 |
| 4,979,076 | 12/1990 | DiBugnara ......................... 361/401 |
| 5,140,745 | 8/1992 | McKenzi, Jr. ........................ 29/852 |
| 5,249,098 | 9/1993 | Rostoker et al. .................. 361/600 |
| 5,420,377 | 5/1995 | Bresin et al. . |

FOREIGN PATENT DOCUMENTS

| | | | |
|---|---|---|---|
| 130410 | 1/1985 | European Pat. Off. ............. 29/832 |
| 4-180692 | 6/1992 | Japan ................................. 29/840 |
| 6-188143 | 7/1994 | Japan . |
| 7288375 | 10/1995 | Japan . |
| 2246243 | 1/1992 | United Kingdom ............... 29/829 |

OTHER PUBLICATIONS

Wannenmacher, Jr.; United States Statutory Invention Registration; "Stress Controlling Mounting Structures for Printed Circuit Boards"; Jul. 1991.

*Primary Examiner*—Carl J. Arbes
*Attorney, Agent, or Firm*—Joseph W. Malleck

[57] ABSTRACT

Method of surface mounting an electronic component to a bonding pad on one side of a supporting insulating board carrying a planar printed circuit thereon, the pad being connected to one or more conductors on the board by use of solder material subject to one or more gas trapping through-hole vias, comprising: (a) creating at least one vent channel below the top plane of the printed circuit and extending from a location at or closely adjacent to one of said vias to a location essentially near a periphery of solder material to be placed thereover; (b) planting a deposit of solder material between the component and pad; (c) bringing the component, solder material and pad together to form an assembly; and (d) heating the assembly to momentarily reflow the solder material in place without shifting, skewing, or tilting of the component, any trapped air in said one vias being allowed to expand and migrate away through the channel to at least the periphery of the pad.

10 Claims, 3 Drawing Sheets

REFLOW SOLDERING TO MOUNTING PADS WITH VENT CHANNELS TO AVOID SKEWING

BACKGROUND OF THE INVENTION

1. Technical Field

This invention relates to the technology of reflow soldering of electronic components to printed circuit boards and more particularly to preventing displacement of surface mounted components during reflow soldering as a result of gas trapped beneath the component.

2. Discussion of the Prior Art

In electronic assemblies it is sometimes necessary or desirable to include features within printed circuit board or component attachment areas which will cause gas to be trapped beneath a surface mount component during assembly. When the assembly is heated during reflow soldering, gas trapped at such a feature expands beneath the component. The expanding gas may lift the component, or if sufficient pressure has built up, may escape violently from the molten solder. In either case, the trapped gas may cause floating, skewing, tilting, lifting or other displacements of the component from the desired mounting position, necessitating increased spacing of components and possibly leading to incomplete or inaccurate solder connections.

Thermal vias are one example of a gas trapping feature which may be beneficially included in a printed circuit board mounting pad. In this case, one or more plated through holes (thermal vias) are included in the component mounting pad to increase the rate of heat transfer from a component generating a substantial amount of heat to a heat transfer pad on the opposite side of the printed circuit board. At least a portion of the surface of the printed circuit board's opposite side (usually including the heat transfer pad) is typically bonded to a metallic heatsink using a thermally conductive adhesive in order to spread the heat generated by such components to the heatsink, improving heat transfer from the electronic assembly to the ambient environment.

When thermal vias are incorporated in a mounting pad, the via opening at the heat transfer pad side of the circuit board is typically sealed, either by a plug in the barrel of the thermal via which is provided to prevent contamination of the heat transfer pad by solder or flux, or by the heatsink adhesive layer, when the heatsink has been bonded to the circuit board prior to soldering. Also, some or all of the via openings on the mounting pad side of the circuit board are sealed prior to soldering by the application of solder paste on the mounting pad. After solder paste application and subsequent placement of the component in the solder paste, a small amount of gas (usually air) is therefore trapped in the via between the plug or heatsink adhesive layer and the solder paste. When the assembly is heated during reflow soldering, this trapped gas expands, forming a bubble. When the solder paste melts, the pressure in this trapped gas bubble can lift the component, or if sufficient pressure has built up, the bubble may migrate toward the periphery of the molten solder and escape violently to the ambient atmosphere. In either case, the component may be displaced from the desired mounting position and remain so after solidification of the molten solder and escape violently to the ambient atmosphere. In either case, the component may be displaced from the desired mounting position and remain so after solidification of the molten solder, necessitating increased spacing of components and possibly leading to incomplete or inaccurate solder connection. Similar detrimental effects can be caused by other gas trapping features such as non-wettable areas included in the mounting pad where solder paste will not adhere closely, or pockets in the component's solderable surface where again solder paste will not adhere closely.

The prior art fails to teach how to solve these problems either because (i) gas trapping features were not employed, (ii) surface mounting was not used, or (iii) components were not attached by reflow soldering.

SUMMARY OF THE INVENTION

In order to mitigate the effects of gas trapping features, the present invention provides vent channels in the mounting pad which provide flow paths through which gas otherwise trapped at these locations may escape to the ambient atmosphere during soldering. Vent channels may be located to provide a continuous flow path from gas trapping features to locations near or beyond the solder material periphery (and hence to ambient atmosphere) or may be located sufficiently near to gas trapping features that expanding gas bubbles tend to migrate into the channels, similarly relieving built up pressure to ambient atmosphere.

It is therefore an object of this invention to provide an improved method of reflow soldering of surface mounted components to pads of printed circuits having thermal vias, slots, depressions or other gas trapping features in the plane of the soldering pad or component.

The invention herein meets the above object as a method of surface mounting an electronic component to a bonding pad on one side of a supporting insulating board carrying a printed circuit, the component being connected to the pad by use of solder material subject to one or more gas trapping features, comprising: (a) creating at least one vent channel, extending from a location at the top plane of the bonding pad which location is at or closely adjacent to one of said gas trapping features, to a location essentially near a periphery of the solder material; (b) planting a deposit of the solder material between the component and bonding pad extending across the gas trapping feature; (c) bringing the component, solder material, and bonding pad together to form an assembly; and (d) heating the assembly to momentarily reflow the solder material in place without shifting, skewing, or tilting of the component, any trapped gas in the features being allowed to expand and migrate away through the channel to at least the periphery of the solder material.

DETAILED DESCRIPTION AND BEST MODE

Figure 1:
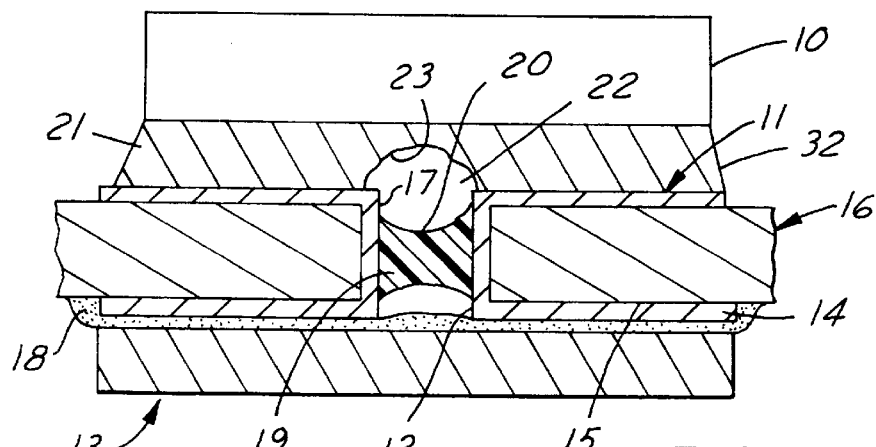
FIG. 1 is a highly enlarged sectional view of a printed circuit board having a component soldered to the surface of a pad thereon, which includes a gas trapping feature in the form of an epoxy plugged thermal via, thereby illustrating the expansion of trapped gas during soldering.

If an electronic component 10, as shown in FIG. 1, were to be surface mounted (reflow soldered) to a conductive pad 11 having one or more gas trapping features such as vias 12 connecting the pad 11 to a heat transfer pad 14 on the opposite side 15 of the board 16, the vias 12 would typically be plugged by polymer 19 to prevent soldering flux (usually of an organic base such as dicarboxcylic acid and rosin) from weeping through the vias opening 17 to contaminate the transfer pad 14, on the opposite side 15, leading to corrosion or inhibition of curing of the adhesive 18 used to attach the heat sink 13 to the board 16. The heat sink 13 is typically an aluminum plate bonded to the circuit by use of such a thermally conductive adhesive 18 (e.g., a ceramic filled polymer) but which is electrically insulating. Plugging is carried out by smearing an electrically non-conductive viscous polymer across the vias opening and thereby forcing the polymer 19 down into the opening to close the opening 17; surface tension of the polymer within the metallic plating of the vias hole causes the upper surface 20 of the plug to be sunk or concave. When a soldering paste 21 is deposited (e.g., by screen printing) onto the conductive pad 11 in preparation for placing the component 10 thereon, the soldering paste extends flatly across the vias opening 17 leaving a small air gap 22 there below as the result of the recessed surface of the plugging. The air in the gap 22, when heated during furnace heating of the assembly to effect soldering, expands as a bubble 23 which may warp upwardly under the soldering paste 21 causing lifting of the component or the bubble may migrate laterally under the paste causing skewing and tilting. In some extreme cases, the bubble may expand so rapidly that the soldering material and component are blown off the circuit board.

Figure 2:
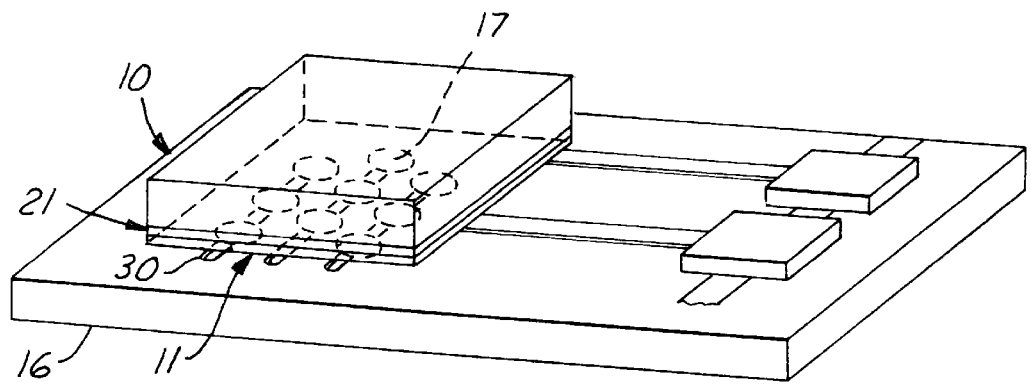
FIG. 2 is a perspective view of a component soldered to a pad, illustrating the use of vent channels of this invention extending from gas trapping features beneath the component to a location adjacent the periphery of the solder paste material; this allows for air bubbles to migrate from the inner gas trapping features during heating of reflow soldering.
Figure 3:
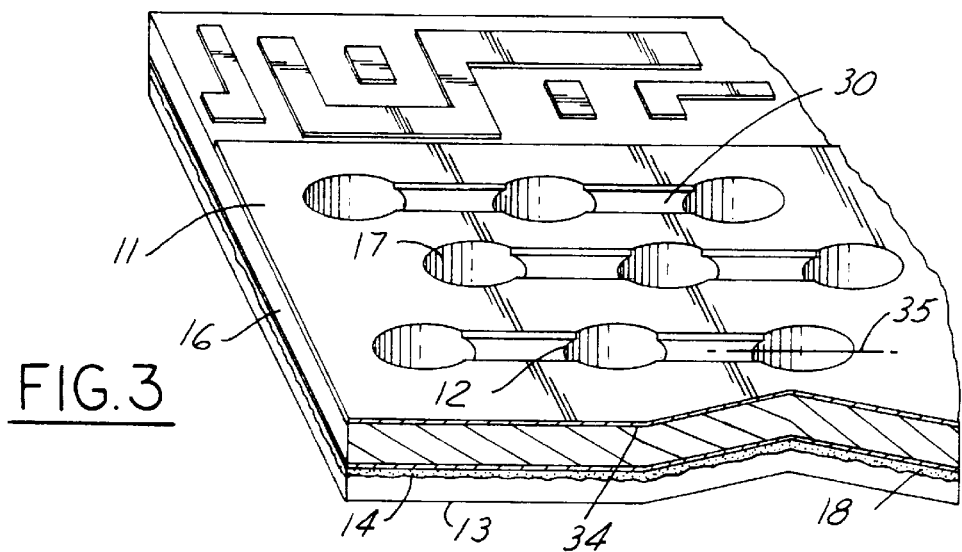
FIG. 3 is a perspective view of a printed circuit board and mounting pad prepared to avoid the gas trapping feature problem in accordance with this invention and illustrating the use of vent channels extending to vias adjacent to the periphery of the solder material to be deposited.
Figure 4:
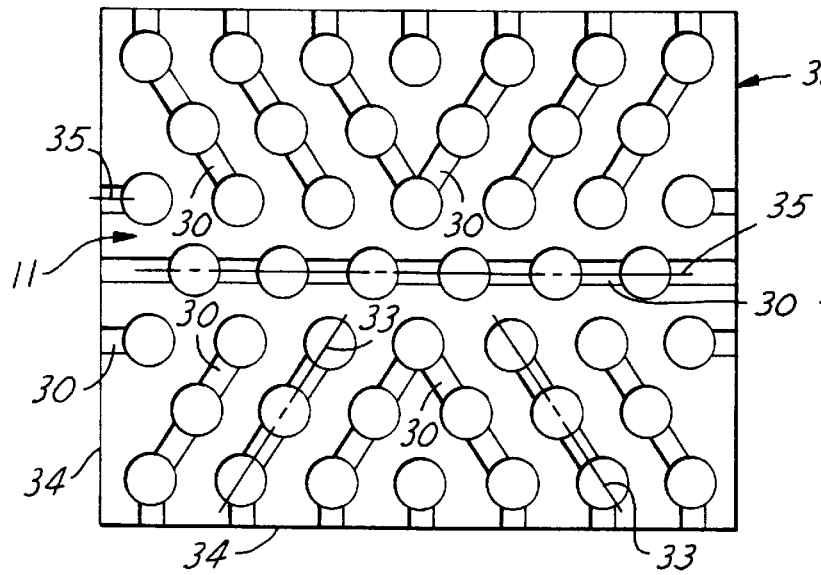
FIG. 4 is plan view of a printed circuit board mounting pad having one pattern of vent channels which vent channels connect rows of vias to the periphery of the pad.

To eliminate lifting and other displacements, but still allow surface mount reflow soldering of the component to a metal bond pad 11 having thermal vias 12, the conductive pad 11 is provided with vents or channels 30 to allow the bubble 23 to be directed to the periphery 32 of the solder paste deposit 21, as shown in FIGS. 2 and 3. The channels can be patterned to extend along rows of vias, either biased at 33 as shown in FIG. 4 to a side 34 of the pad 11, or aligned parallel at 35 with a side 34 of the pad, as also shown therein. The channels 30 must interconnect interior thermal vias (with reference to the footprint of the pad 11) with vias adjacent to or beyond the periphery of the solder paste material or with the side of solder material, as shown, to promote venting or migration of any bubble 23.

Figure 5:
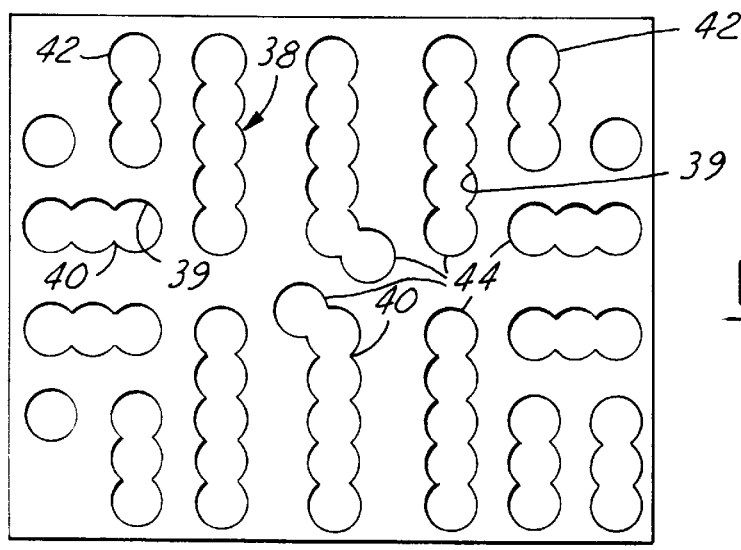
FIG. 5 is a plan view like that of FIG. 4 illustrating another pattern of vent channels created by overlapping vias which connect to the periphery of the pads.

Instead of special grooves, a vent channel 38 may be created by drilling the thermal via openings 39 so they overlap at 40 as in FIG. 5. The vias may or may not be plugged. The overlapping is carried out to connect interior vias 41 with peripheral vias 42 (with respect to the soldering material) that are at least partially open to atmosphere. Overlapping vias have advantages, such as increasing the heat transfer capability of the pad in a given pad area, and increasing the design flexibility for peripheral vias. The overlapping of thermal vias in a row creates a type of plated slot. No longer must the thermal vias be separated by a minimum distance, such as 0.009 inches, to avoid interference with neighboring holes when carrying out drilling; the spacing can now be smaller. The order of the hole drilling can be selected to balance the pressure on the drill bit.

Figure 6:
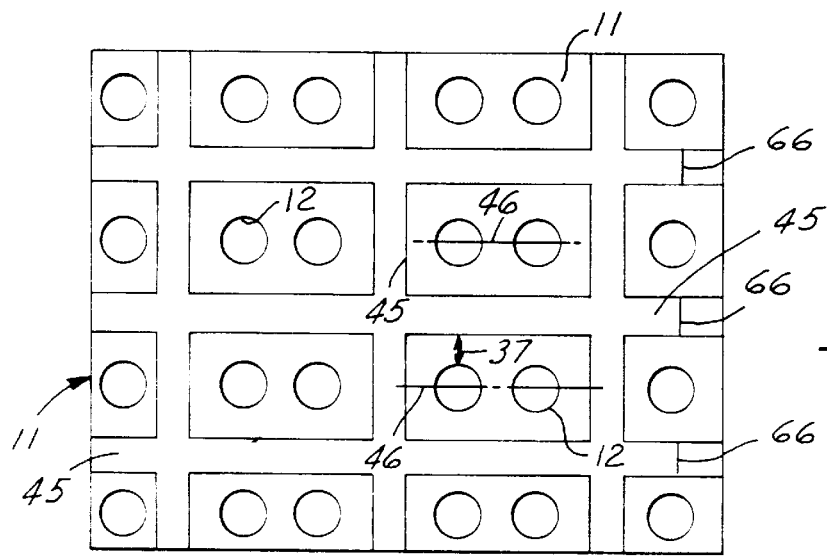
FIG. 6 is still another plan view of the printed circuit board mounting pad showing the use of vent channels located close to but spaced from vias.

The channels 45 may alternatively be as shown in FIG. 6, running between the rows 46 of vias 12 (continuously spaced therefrom) but in such close relationship, such as a distance 37 preferably no greater than 0.01 inch, to allow the air bubble to seep from the vias 12 under the solder paste to reach the most adjacent groove 45 through only a very short distance with little or no effect on the solder paste. The bubble or air within a via is thus vented to the periphery 32 of the solder paste deposit. The channel may extend to the edge of the pad 11 or short of the pad edge as shown at 66.

Each groove is preferentially formed by a subtractive technique comprising essentially seven steps which incorporate standard steps of fabricating the printed circuit board. First, the starting board has a thin copper layer deposited completely over one or both broad sides. The board is drilled at desired locations for placing the vias as required. Second, the conductive metal coating is covered with a photo resist coating which areas are masked to be included in the desired and predetermined printed circuit including the pads containing the drilled holes with the vias and the grooves in the pads. After such masking, the photo resist is exposed to ultraviolet light to produce curing in the exposed areas. Next, the uncured portions of the photo resist and mask are washed off by placing the board in a washing bath. The copper or conductive metal, that was covered by the uncured portions of the photo resist is etched away using an etching bath. Lastly, the cured resist portions are washed away which were utilized to protect the desired areas of the printed circuit metallization that are to be in the final assembly. This leaves metal defining the proper printed circuit, plated vias and channels.

Other standard circuit board fabrication techniques may be employed such as the additive process to locate the conductive metal forming the circuit pattern, mounting pads, and vias, and defining the channels on the surface of the board as desired.

With the grooves in place the solder paste is then deposited on the printed circuit mounting pads. Please note that the application of the solder paste does not eliminate the existence of a gap between the plugged surface 20 and the solder paste. The air in such gap can now migrate through the grooves channels of a pattern, such as provided for in FIGS. 4 and 5, or migrate a short distance under the solder paste to an adjacent channel if the patterns of FIG. 6 are used. The air in such gap may thereby expand and migrate without disrupting the paste in any significant manner.

Figure 7:
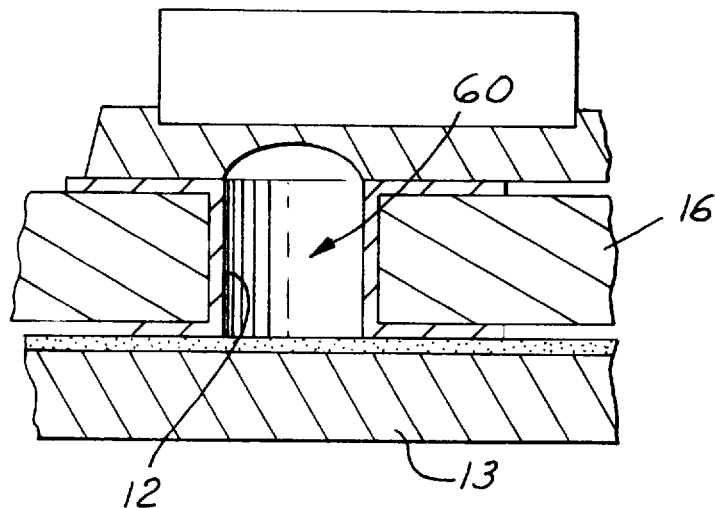
FIGS. 7–9 are fragmentary sectional views of alternative surface mounted component assemblies illustrating different gas trapping features, each eliminated by the vent channels of this invention.
Figure 8:
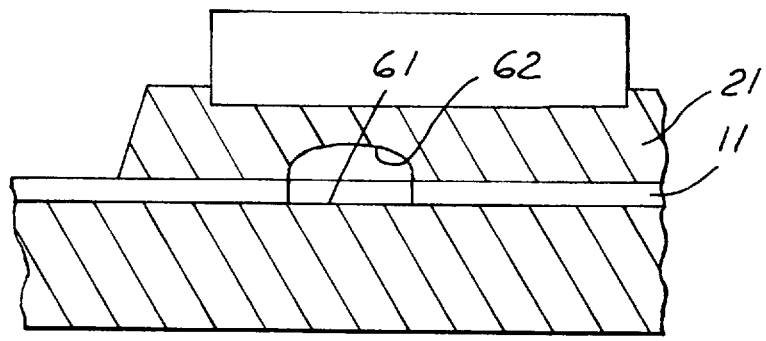
Figure 9:
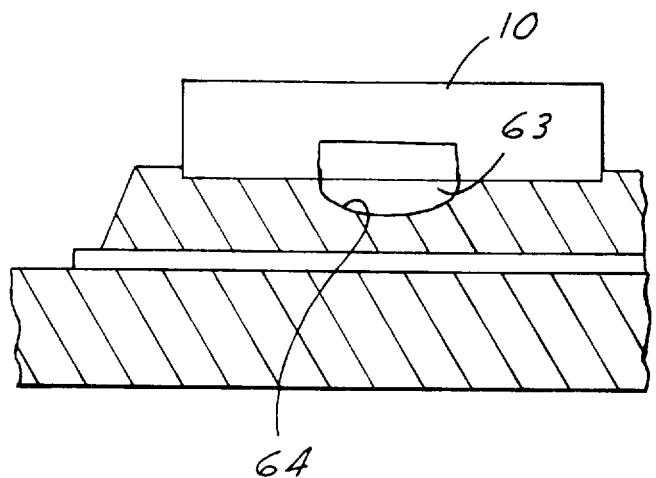

The gas trapping feature 60 may also arise, as shown in FIG. 7, by use of an unplugged via 12. Air is trapped in the space 60 within the via 12 by the heat sink 13 extending across the bottom of the board 16, which heat sink was attached prior to soldering. The gas trapping feature may also arise, as shown in FIG. 8, without the existence of any vias or heat sink, but with the existence of non-wettable areas 61 located within the periphery of the solder paste 21 on the bonding pad 11. The solder paste 21 will not adhere tightly to the non-wettable area 61 and thereby allow air to form a pocket 62 and hence form the gas trapping feature. Similarly, the gas trapping feature may result when a non-wettable area or pocket 64 is included in the solderable area of the component as shown in FIG. 9 at 63.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of this invention.

We claim:

1. Method of surface mounting an electronic component to a bonding pad on one side of a supporting insulating board carrying a printed circuit thereon, the component being connected to the pad by use of solder material subject to one or more gas trapping features separate from the solder material comprising:

(a) creating at least one vent channel, extending into the thickness of the mounting pad, from a location that is at or closely adjacent to one of said gas trapping features, to a location essentially near a periphery of the solder material;

(b) planting a deposit of the solder material between the component and bonding pad extending over the gas trapping feature;

(c) bringing the component, solder material and bonding pad together to form an assembly; and (d) heating the assembly to momentarily reflow the solder material in place without shifting, skewing, or tilting of the component, any trapped gas in the features being allowed to expand and migrate away through the channel to at least the periphery of the solder material.

2. Method of surface mounting an electronic component to a mounting pad on one side of a supporting insulating board, said insulating board carrying conductors on said one side and a heat sink on the opposite side of said board, said board also having through-hole thermal vias through which said conductors and heat sink are connected, the component being connected to the mounting pad by use of solder material subject to gas trapping in said thermal vias comprising:

(a) creating at least one vent channel, extending into the thickness of the mounting pad, from a location that is at or closely adjacent to said thermal via, to a location essentially near a periphery of the solder material;

(b) planting a deposit of the solder material between the component and mounting pad extending over the thermal via;

(c) bringing the component, solder material and bonding pad together to form an assembly; and (d) heating the assembly to momentarily reflow the solder material in place without shifting, skewing, or tilting of the component, any trapped gas in the thermal via being allowed to expand and migrate away through the channel to at least the periphery of the solder material.

3. The method as in claim 1 which said vent channel is created by a series of overlapping vias.

4. The method as in claim 2 in which said vent channel connects interior vias with peripheral vias with respect to said mounting pad or connects with the periphery of deposited solder material.

5. The method as in claim 2, in which a plurality of vent channels are used in a pattern, the pattern of arrangement of said vent channels being selected from either (i) rows of vias biased with respect to a side of the pad, or (ii) rows of vias that are aligned parallel with the periphery of the pad.

6. The method as in claim 2, in which said vent channels extend closely adjacent to but are spaced between the rows of vias to an area most adjacent to the periphery of the pad, said vent channels not intersecting with the vias.

7. A method of surface mounting electronic components to a printed circuit on one side of a supporting insulating board, the printed circuit being connected to one or more conductors on the opposite side of such board by use of one or more plated through-hole vias having ends lying in the plane of the circuit, comprising:

(a) plugging at least one via with a material substantially non-wettable by a solder;

(b) creating at least one vent channel, extending through the thickness of the printed circuit from a location that is at or closely adjacent to said at least one via, to essentially the periphery of the solder material to be placed thereover;

(c) planting a deposit of the solder material between the component and pad, the solder material having a surface that at least covers said vent channel;

(d) placing said component on said soldering material over the printed circuit portion and over said vent channel; and (e) heating the assembly to momentarily reflow the soldering material in place without shifting, skewing or tilting of the component, any trapped air in said vias being allowed to expand and migrate away from said vias through said channels to at least the periphery said solder deposit.

8. The method as in claim 7, in which said component is soldered to a mounting pad formed as part of the printed circuit, said pad containing a plurality of vias.

9. The method as in claim 8, in which said vent channel extends between rows of said vias to other vias most adjacent to the periphery of the solder material.

10. The method as in claim 9, in which the depth of the channel is in the range of 0.001–0.010 inches.

* * * * *